US007930614B2

(12) United States Patent
Sato

(10) Patent No.: US 7,930,614 B2

(45) Date of Patent: Apr. 19, 2011

(54) TEST APPARATUS AND TEST METHOD

(75) Inventor: Shinya Sato, Tokyo (JP)

(73) Assignee: Advantest Corporation, Tokyo (JP)

(*) Notice: Subject to any disclaimer, the term of this patent is extended or adjusted under 35 U.S.C. 154(b) by 1079 days.

(21) Appl. No.: 11/714,071

(22) Filed: Mar. 5, 2007

(65) Prior Publication Data

US 2007/0277065 A1 Nov. 29, 2007

Related U.S. Application Data

(63) Continuation of application No. PCT/JP2005/017052, filed on Sep. 15, 2005.

(30) Foreign Application Priority Data

Oct. 14, 2004 (JP) ................................ 2004-300782

(51) Int. Cl.
*H03M 13/00* (2006.01)

(52) U.S. Cl. ......................... 714/758; 714/754; 714/769

(58) Field of Classification Search .................. 714/758, 714/754, 763, 768, 769, 764, 703, 5
See application file for complete search history.

(56) References Cited

U.S. PATENT DOCUMENTS 4,924,465 A * 5/1990 Matsubara et al. ........... 714/703
5,553,231 A * 9/1996 Papenberg et al. ............... 714/5

FOREIGN PATENT DOCUMENTS

JP 53-083538 A 7/1978
JP 62-120699 A 6/1987
JP 64-008600 1/1989
JP 02-276099 A 11/1990
JP 11-073796 3/1999

OTHER PUBLICATIONS

International Search Report issued in International Application No. PCT/JP2005/017052 mailed on Dec. 27, 2005 and English translation thereof, 4 pages.

K. Sakui, A High Density NAND Flash Memory Technology for a Silicon Movie Era, FED Journal, vol. 11, No. 3, 2000, pp. 76-88.

Notification of Reasons for Refusal for Japanese Application No. 2006-540854 mailed Jul. 28, 2009 and English translation thereof, 4 pages.

Partial English tanslation of Japanese Publication No. 53-83538, Publication Date: Jul. 24, 1978, 1 page.

Patent Abstracts of Japan, Publication No. 02-276099, Publication Date: Nov. 9, 1990, 1 page.

Patent Abstracts of Japan, Publication No. 62-120699, Publication Date: Jun. 1, 1987, 1 page.

Patent Abstracts of Japan, Publication No. 64-008600, Publication Date: Jan. 12, 1989, 1 page.

* cited by examiner

*Primary Examiner* — Fritz Alphonse
(74) *Attorney, Agent, or Firm* — Osha Liang LLP

(57) ABSTRACT

A test apparatus is provided for testing memory under test which stores a data string including an error correction code in the form of additional data. The test apparatus comprises: a logic comparator which compares each of the data sets included in a data string read out from the memory under test with a corresponding anticipated value created beforehand; a data error count unit which counts the number of data sets that do not match the respective anticipated values; and a defect detection unit which provides a function whereby, in a case that the count value counted by the error count unit exceeds a predetermined upper limit number which is equal to or greater than 1, determination is made that the memory under test is defective.

12 Claims, 6 Drawing Sheets

TEST APPARATUS AND TEST METHOD

CROSS REFERENCE TO RELATED APPLICATION

This is a continuation application of PCT/JP2005/017052 filed on Sep. 15, 2005 which claims priority from a Japanese Patent Application(s) NO. 2004-300782 filed on Oct. 14, 2004, the contents of which are incorporated herein by reference.

BACKGROUND

1. Technical Field

The present invention relates to a test apparatus and a test method. Particularly, the present invention relates to a test apparatus and a test method, for testing memory under test which stores a data string including an additional error correction code. The present application claims priority from a Japanese Patent Application No. 2004-300782 filed on Oct. 14, 2004, the contents of which are incorporated herein by reference.

2. Related Art

With conventional semiconductor memory test apparatuses, the output from memory under test is logically compared with an anticipated value for each test cycle. With such an arrangement, in a case that the output matches the anticipated value in the comparison step, a "pass" determination is made, which means that the memory is acceptable. On the other hand, in a case that the output does not match the anticipated value, a "fail" determination is made, which means that the memory is unacceptable. Let us consider a case of testing memory under test such as flash memory, which operates in a manner in which the stored data is read out over multiple cycles in increments of pages, and error correction codes are added in increments of pages. In such a case, with conventional techniques, even if only one fall has been detected, determination is made that the memory under test is defective.

In some cases, the program disturb mode occurs in the flash memory. In this case, the data stored in any storage cell other than the writing target storage cell changes, leading to non-permanent software error. (see Non-Patent document 1) In practical use, in a case that such a software error has occurred, a memory controller for controlling the flash memory corrects the error in the data read out from the flash memory.

[Non-Patent document 1] A high density NAND Flash memory technology for a silicon movie era, FED Journal, Vol. 11, No. 3, 2000, pp. 76-78

With conventional semiconductor memory test apparatuses, in a case of detecting a fail in any test cycle, determination is made that the memory under test is defective. Let us consider a case of testing flash memory where it is in the nature of the flash memory under test to allow a certain amount of software error to occur. In such a case, the conventional semiconductor memory test apparatuses determine that such flash memory is defective.

SUMMARY

Accordingly, it is an object of the present invention to provide a test apparatus and a test method for solving the aforementioned problem. This object is achieved by combining the features described in the independent claims in the Claims. Also, the dependent claims lay forth further advantageous specific examples of the present invention.

A first aspect of the present invention relates to a test apparatus for testing a memory under test which stores a data string that includes an error correction code in the form of additional data The test apparatus includes: a logic comparator which compares each of the data sets included in the data string read out from the memory under test with a corresponding anticipated value created beforehand; a data error count unit which counts the number of data sets that do not match the respective anticipated values; and a defect detection unit which provides a function whereby, in a case that the count value counted by the data error count unit exceeds a predetermined upper limit value which is equal to or greater than 1, determination is made that the memory under test is defective.

The defect detection unit may provide a function whereby, in a case that the count value exceeds the upper limit value which is the maximum number of errors that can be corrected for each data string using the error correction code, determination is made that the memory under test is defective.

Let us consider a case of testing the memory under test having a first storage region that stores a data string including an error correction code in the form of additional data and a second storage region that stores a data string without involving the error correction code. In such a case, the defect detection unit may provide a function whereby, in a case that the count value exceeds the upper limit number for the data string read out from the first storage region, determination is made that the memory under test is defective. Also, the detection unit may provide a function whereby, in a case that at least one data set stored in a data string does not match a corresponding anticipated value for the data string read out from the second storage region, determination is made that the memory under test is defective.

Also, the logic comparator may serially compare the data set included in each data string with the corresponding anticipated value for multiple the data strings read out from separate storage regions in the memory under test. Also, the data error count unit may increment the count value for each data string every time data that does not match the corresponding anticipated value is detected. Also, the defect detection unit may provide a function whereby, in a case that the count value counted by the error count unit exceeds the upper limit value, determination is made that the memory under test is defective. Also, the test apparatus may further includes a test processing unit that provides a function whereby, upon completion of a defect detection test for each data string, the count value is initialized, and the logic comparator is instructed to start a comparison between the next data string and the corresponding anticipated value.

Also, in a case that the data included in the data string does not match the anticipated value, and in a case that the data does not match a predetermined data value, the defect detection unit may determine that the memory under test is defective. Also, in a case that the data matches the predetermined data value, and in a case that the number of data sets that do not match the anticipated value exceeds the upper limit number, the defect detection unit may determine that the memory under test is defective.

Also, the test apparatus may further includes a test processing unit which writes data strings multiple times to the same storage region in the memory under test, and which reads out the data string thus written from the memory under test after every writing processing; and a storage region error count unit which counts, for each storage region, the number of error-detection instances in which the data included in the data string read out from the storage region does not match the corresponding anticipated value. With such an arrangement, in a case that the count value counted by the storage region error count unit for the storage region that stores the data string to be read out is greater than a predetermined value, and in a case that at least one data set included in the data string does not match the anticipated value, the defect detection unit may determine that the memory under test is defective. Also, in a case that the count value counted by the storage region error count unit for the storage region that stores the data string to be read out is equal to or smaller than the predetermined value, and in a case that the count value counted by the data error count unit exceeds the upper limit value, the defect detection unit may determine that the memory under test is defective.

A second aspect of the present invention relates to a test apparatus for testing a memory under test which stores a data string that includes an error correction code in the form of additional data. The test apparatus includes: a logic comparator which compares each of the data sets included in the data string read out from the memory under test with a corresponding anticipated value created beforehand; and a defect determining section that detects that the memory under test is defective when the data string does not match the anticipated value and the data string is not corrected by the error correction code.

A third aspect of the present invention relates to a test method for testing a memory under test which stores a data string that includes an error correction code in the form of additional data. The test method includes the steps of: comparing each of the data sets included in the data string read out from the memory under test with a corresponding anticipated value created beforehand; counting the number of data sets that do not match the respective anticipated values; and detecting that the memory under test is defective when the count value counted by the data error count unit exceeds a predetermined upper limit value which is equal to or greater than 1.

A fourth aspect of the present invention relates to a test method for testing a memory under test which stores a data string that includes an error correction code in the form of additional data. The test method includes the steps of: comparing each of the data sets included in the data string read out from the memory under test with a corresponding anticipated value created beforehand; and detecting that the memory under test is defective when the data string does not match the anticipated value and the data string is not corrected by the error correction code.

Note that the above overview of the invention is not a comprehensive listing of all essential features of the present invention, and that sub-combinations of these feature groups may also be encompassed by the invention.

DESCRIPTION OF EXEMPLARY EMBODIMENTS

The invention will now be described based on preferred embodiments, which do not intend to limit the scope of the invention, but exemplify the invention. All of the features and the combinations thereof described in the embodiments are not necessarily essential to the invention.

Figure 1:
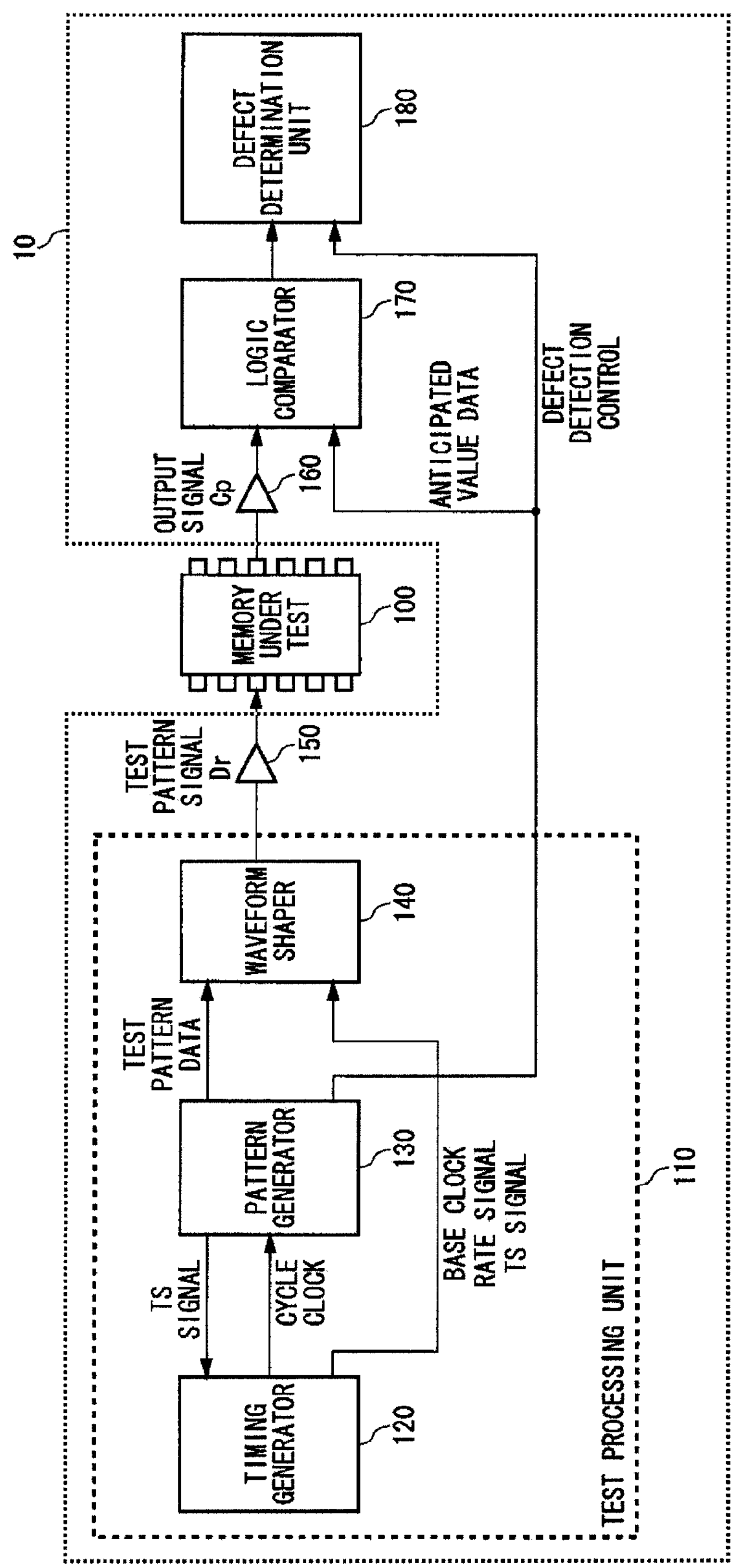
FIG. 1 shows a configuration of a test apparatus 10 according to an embodiment of the present invention.

FIG. 1 shows a configuration of a test apparatus 10 along with memory under test 100 according to the present embodiment. The test apparatus 10 tests the memory function of the memory under test 100. Here, the memory under test 100 is an SOC (system on chip) or the like including semiconductor memory or having a memory function in the form of an additional function. The SOC stores a data string with an additional error correction code. Let us consider a case in which the data string read out from the memory under test 100 does not match the anticipated data string. Even in such a case, with the test apparatus 10 according to the present embodiment, in a case that such a data string read out from the memory under test 100 can be corrected using the error correction code, the test apparatus 10 does not determine that the memory under test 100 is defective. Accordingly, the purpose of test apparatus 10 is to provide an appropriate test of the memory under test 100. Description will be made below regarding an example in which the memory under test 100 is flash memory.

The test apparatus 10 includes the test processing unit 110, the driver 150, the comparator 160, the logic comparator 170, and the defect determination unit 180. The test processing unit 110 controls the test of the memory under test 100. More specifically, in the test of the memory under test 100, the test processing unit 110 writes data strings multiple times to the same storage region. Here, the test processing unit 110 reads out the data string thus written after every writing processing. Thus, the test processing unit 110 transmits the data thus read out from the memory under test 100 to the logic comparator 170. With such an arrangement, the test processing unit 110 performs a writing/reading test to/from the same storage region while varying the data string. Thus, such an arrangement can determine whether or not the storage cell of the corresponding storage region is defective, using the logic comparator 170 and the defect determination unit 180.

The test processing unit 110 includes a timing generator 120, a pattern generator 130, and a waveform shaper 140. The timing generator 120 generates a cycle clock that indicates each test cycle and a RATE signal that indicates the start timing for each test cycle, based upon the timing data specified by the timing set signal (TS signal) output from the pattern generator 130. Then, the timing generator 120 supplies the cycle clock to the pattern generator 130. On the other hand, in addition to the base clock of the test apparatus 10, the generator 120 supplies the RATE signal and the TS signal to the waveform shaper 140.

The pattern generator 130 generates test pattern data, which is to be supplied to the memory under test 100, based on the cycle clock. The pattern generator 130 supplies the test pattern data thus generated to the waveform shaper 140. The test pattern data includes: a test pattern made up of signals to be supplied to the memory under test 100 that are used for writing the data string to the memory under test 100; and a test pattern made up of signals to be supplied to the memory under test 100 that are used for reading out the data string thus written from the memory under test 100.

The waveform shaper 140 shapes the waveform of the test pattern data based upon the base clock, the RATE signal, and the TS signal, which determines the timing at which the test pattern data is to be supplied to the memory under test 100.

The driver 150 supplies, to the memory under test 100, the test pattern data thus shaped by the waveform shaper 140 as a test pattern signal. The comparator 160 compares the output signal, which is output from the memory under test 100 according to the test pattern, with the predetermined reference voltage for each test pattern, thereby obtaining the logic value of the output signal.

The logic comparator 170 compares each data set included in the data string, each data set having been read out from the memory under test 100 according to the test pattern, with an anticipated value generated beforehand by the pattern generator 130. The defect determination unit 180 determines whether or not the memory under test 100 is defective based upon the comparison results obtained by the logic comparator 170.

Figure 2:
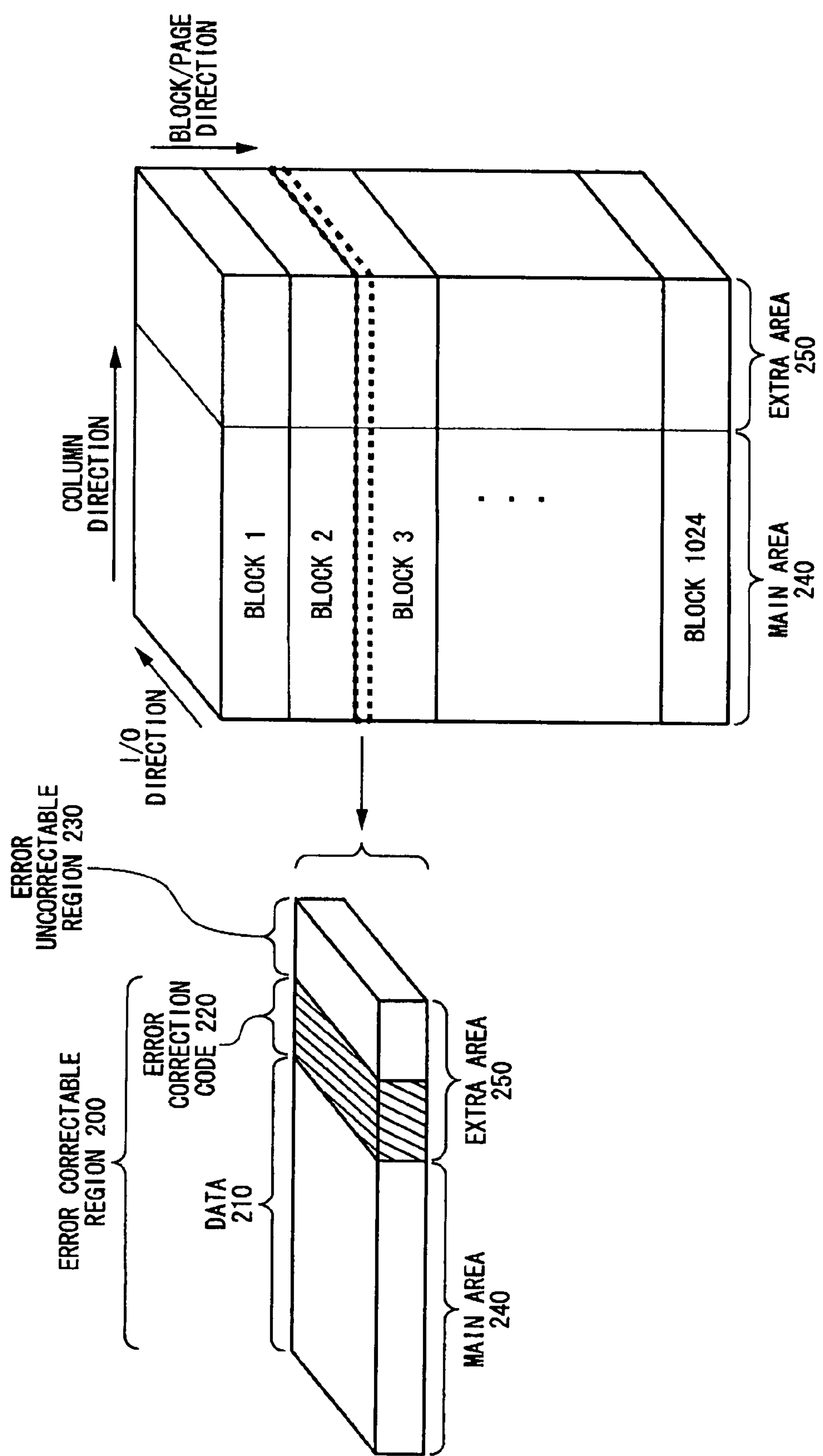
FIG. 2 shows a storage region of memory under test 100 according to the embodiment of the present invention.

FIG. 2 shows the storage region of the memory under test 100 according to the present embodiment. The storage region of the memory under test 100 according to the present embodiment is partitioned into multiple blocks. Each block has a data storage capacity of 64 KB, for example. Furthermore, each block includes multiple pages, e.g., 32 pages or the like. The memory under test 100 according to the present embodiment provides reading/writing of data strings in increments of pages each of which has a data storage capacity of 2 KB or the like, for example. More specifically, the memory under test 100 has multiple data IO terminals for 8-bit data or the like, for example. With such an arrangement, data is transferred via these multiple data IO terminals for each input/output cycle in increments of words (1 word corresponds to 8 bits, for example). With such an arrangement, for each reading or writing processing, all the data stored in each page is read out along the column direction in increments of words and in order of columns, and the data thus read out is transferred. Such an arrangement provides reading/writing in increments of pages.

The storage region of the memory under test 100 includes a main area 240 and an extra area 250. The main area 240 is a region for storing the data 210 which is to be stored in the memory under test 100. The extra area 250 is a region for storing an error correction code 220 used for correcting bit error that has occurred in the data 210, information which indicates access restrictions for a page, and so forth. Also, the storage region provided in the memory under test 100 can be classified into an error correctable region 200 and an error uncorrectable region 230 based upon the error correctability. The error correctable region 200 is an example of a first storage region according to the present invention. That is to say, the error correctable region 200 stores the data 210 and the error correction code 220, i.e., stores a data string including the error correction code in the form of additional data. In practical use of the memory under test 100 which is to be under test, a memory controller is connected to the memory under test 100 for controlling the memory under test 100. With such an arrangement, the memory controller has a function whereby the correctable errors are corrected using the error correction code 220, even in a case that bit errors have occurred in the error correction region 200. On the other hand, the error uncorrectable region 230 is an example of a second storage region according to the present invention. That is to say, the error uncorrectable region 230 stores a data string without involving the error correction code. In a case that bit errors have occurred in the error uncorrectable region 230, the memory controller cannot correct such bit errors.

Figure 3:
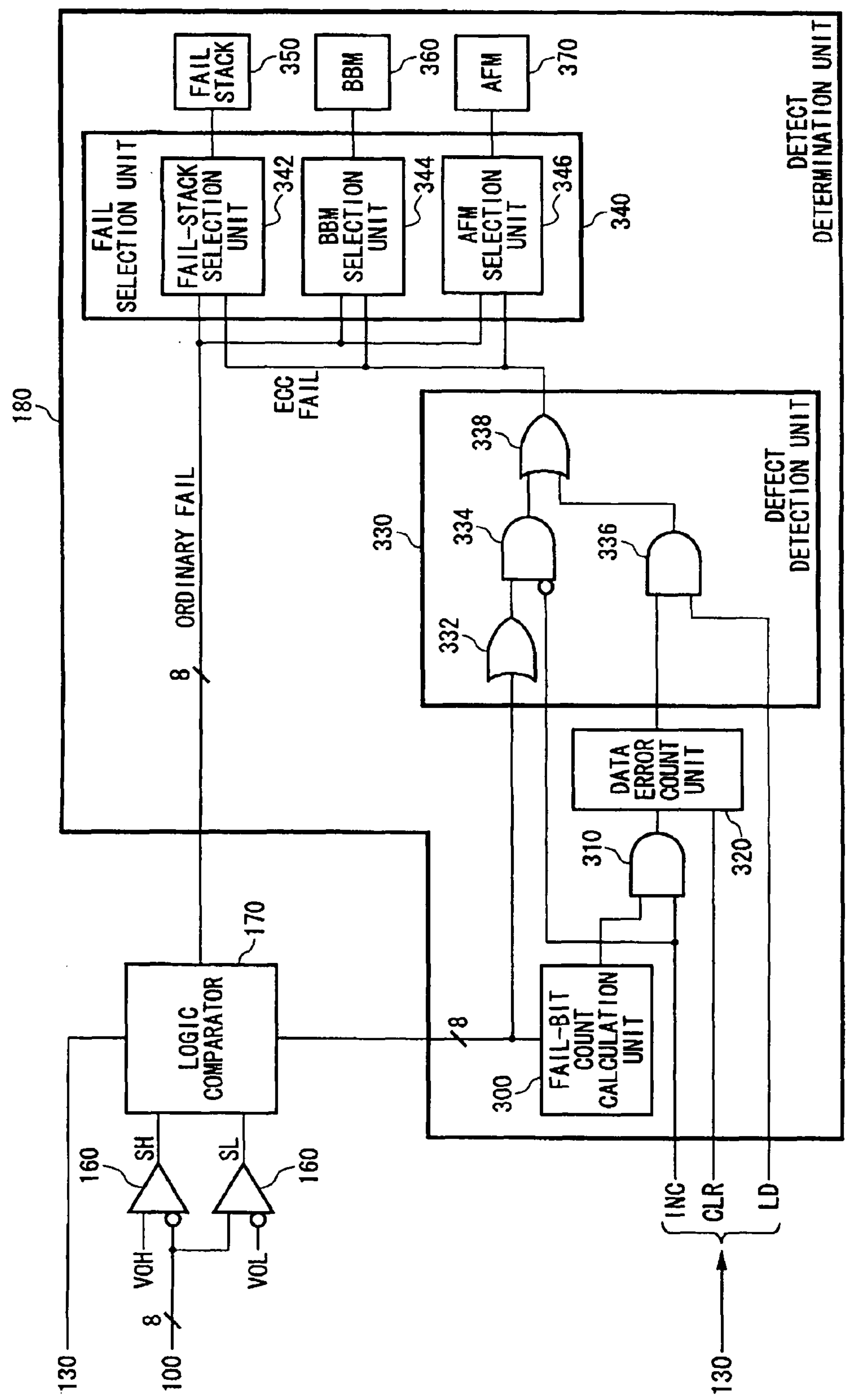
FIG. 3 shows a configuration of a defect determination unit 180 according to the embodiment of the present invention.

FIG. 3 shows a configuration of the defect determination unit 180 according to the present embodiment, along with the comparator 160 and the logic comparator 170. The comparator 160 sequentially receives data sets, which are included in multiple data strings read out from separate storage regions in the memory under test 100, in increments of 8-bit data sets via the data IO terminals of the memory under test 100. Then, the comparator 160 compares the voltage input for each bit with a threshold voltage VOH that corresponds to the logic value H, and with a threshold voltage VOL that corresponds to the logic value L. With such an arrangement, for each bit, in a case that determination has been made that the bit indicates the logic value H, the comparator 160 outputs SH=1. On the other hand, in a case that determination has been made that the bit indicates the logic value L, the comparator 160 outputs SL=1.

The logic comparator 170 sequentially compares each of the data sets, which are included in multiple data strings, with the corresponding anticipated value. The logic comparator 170 according to the present embodiment compares the data of one word (=8 bits) with the anticipated value of one word for each input/output cycle. The logic comparator 170 outputs comparison results in the form of a pass/fail signal having a data structure as follows. That is to say, in a case that the bit data matches the anticipated bit data, the corresponding bit of the pass/fail signal is set to 0 (which indicates "pass"). On the other hand, in a case that the bit data does not match the anticipated bit data, the corresponding bit of the pass/fail signal is set to 1 (which indicates "fail").

The defect determination unit 180 includes: a fail-bit count calculation unit 300; an AND gate 310; a data error count unit 320; a defect detection unit 330; a fail selection unit 340; a fail stack unit 350; a BBM 360; and an AFM 370. The fail-bit count calculation unit 300 calculates the number of fail signals, i.e., the number of "1" bits, included in the pass/fail signal in increments of words. The AND gate 310 outputs, to the data error count unit 320, the AND of each bit of the pass/fail signal and an INC signal that indicates the period for counting the number of fail signals. With such an arrangement, during a period in which the number of fail signals is to be counted, the AND gate 310 supplies, to the data error count unit 320, the number of fail signals thus calculated by the fail-bit count calculation unit 300. On the other hand, during a period in which the number of fail signals is not to be counted, the AND gate 310 supplies a value of 0 to the data error count unit 320.

Of the data sets included in the data string, the data error count unit 320 counts the number of data bits that do not match the respective anticipated values. More specifically, the data error count unit 320 increments the number of fail signals input from the AND gate 310 every input/output cycle for each data string. Here, there may be a limit on the number of fail signals that can be counted by the data error count unit 320. With such an arrangement, in a case that the number of fail signals thus counted reaches the upper limit value, the data error count unit 320 stops the counting-up operation. For example, the data error count unit 320 may store, in the form of 2-bit data, the number of data bits that do not match the respective anticipated values. With such an arrangement, in a case that the number of fail signals reaches three, the data error count unit 320 may stop the counting-up operation. With such an arrangement, in a case that the count value exceeds a predetermined upper limit value which is equal to or greater than 1, the data error count unit 320 sets its output to "1". Thus, the data error count unit 320 notifies the defect detection unit 330 that the count value has exceeded the predetermined upper limit value. On the other hand, upon reception of a CLR signal from the pattern generator 130, the data error count unit 320 initializes the counted value, i.e., sets the counted value to "0".

The defect detection unit 330 receives the INC signals from the logic comparator 170 and the pattern generator 130, the output from the data error count unit 320, and the LD signal from the pattern generator 130. The defect detection unit 330 detects a defect in the memory under test 100 based upon these signals. The defect detection unit 330 includes the OR gate 332, the gate 334, the AND gate 336, and the OR gate 338. The defect detection unit 330 detects a defect in the memory under test 100 based upon the following conditions.

(1) In a case that, for any data string, the count value counted by the data error count unit 320 exceeds a predetermined upper limit value which is equal to or greater than 1, a defect is detected in the memory under test 100. More specifically, first, the data error count unit 320 increments the count value for each data string every time the data that does not match the predetermined anticipated value is detected. Next, in a case that the count value exceeds the upper limit number, the data error count unit 320 sets its output to “1”. Then, the AND gate 336 outputs the AND of the output of the data error count unit 320 and the LD signal. With such an arrangement, the output of the data error count unit 320 is supplied to the fail selection unit 340 via the OR gate 338 according to an instruction from the pattern generator 130. With such an arrangement, in a case that the output of the data error count unit 320 is “1”, a combination of the AND gate 336 and the OR gate 338 notifies the fail selection unit 340 of the defect in the memory under test 100 at a timing according to the LD signal.

Here, the upper limit value is set in the range of values that enable the errors in the data string to be corrected using the error correction code 220. Let us consider an arrangement in which the aforementioned upper limit number is set to the maximum number of errors that still enables the errors in each data string to be corrected using the error correction code. With such an arrangement, in a case that the count value counted by the data error count unit 320 exceeds the aforementioned maximum value, i.e., in a case that the errors in the data string cannot be corrected, the defect detection unit 330 detects a defect in the memory under test 100. For example, let us consider an arrangement that employs an error correction code having a function of detecting two-bit errors, and a function of correcting a single-bit error. Furthermore, let us say that the aforementioned upper limit is set to “1”. With such an arrangement, in a case of detection of two-bit or more errors, the defect detection unit 330 detects a defect in the memory under test 100.

(2) Regarding a data string read out from the error uncorrectable region 230, in a case that at least one data set included in the data string does not match the corresponding anticipated value, the defect detection unit 330 detects a defect in the memory under test 100. Let us consider a case in which a fail signal has been output with respect to any one of the data sets included in the data strings read out from the error uncorrectable region 230. In this case, the error in such data can not be corrected. Accordingly, in such a case, the defect detection unit 330 detects a defect in the memory under test 100. More specifically, the OR gate 332 outputs the OR of the pass/fail signals output from the logic comparator 170. With such an arrangement, in a case that at least one data bit does not match the corresponding anticipated value, the OR gate 332 outputs the signal “1”, which indicates that at least one data bit does not match the corresponding anticipated value. The gate 334 outputs the OR of the output from OR gate 332 and the NOT of the INC signal. With such an arrangement, in a case that the OR gate 332 outputs “1” during the input/output cycles for error-uncorrectable data while the INC signal is set to “0”, the gate 334 transmits a notification to the fail selection unit 340 via the OR gate 338 that a defect has been detected in the memory under test 100.

The fail selection unit 340 receives an ordinary fail signal which is a pass/fail signal that indicates defects in the memory under test 100 in increments of input/output cycles, and an ECC fail signal that indicates defects in the memory under test 100 in increments of data strings. The fail selection unit 340 includes a fail stack selection unit 342, a BBM selection unit 344, and an AFM selection unit 346. The fail stack selection unit 342 selects, from among the ordinary fail signal and the ECC fail signal, the type of fail signal which is to be stored in the fail stack 350 that stores, in increments of the memory units 100 under test, the information regarding whether or not any defect has been detected in the memory under test 100. Let us consider a case of storing a defect based upon the ordinary fail signal. In this case, in a case that at least one data set does not match the corresponding anticipated value, the fail stack 350 stores the information that the memory under test 100 is defective. On the other hand, let us consider a case of storing a defect based upon the ECC fail signal, wherein the target data string is an error correctable string. In this case, in a case that the number of data sets that do not match the respective anticipated value exceeds the upper limit number, the fail stack 350 stores the information that the memory under test 100 is defective.

The BBM selection unit 344 selects, from among the defect type based upon the ordinary fail signal and the defect type based upon the ECC fail signal, the defect type which is to be stored in the BBM (Bad Block Memory) 360 that stores the block number of the block in which a defect has been detected. Let us consider a case of storing a defect based upon the ordinary fail signal. In such a case, in a case that at least one data set within a data string included in a block does not match the corresponding anticipated value, the BBM 360 stores the information that the memory under test 100 is defective with respect to this target block. On the other hand, let us consider a case of storing a defect based upon the ECC fail signal, wherein the data string included in a target block is an error correctable string. In this case, in a case that the number of data sets that do not match the respective anticipated values exceeds the upper limit number, the BBM 360 stores the information that the memory under test 100 is defective with respect to this target block.

The AFM selection unit 346 selects, from among the defect type based upon the ordinary fail signal and the defect type based upon the ECC fail signal, the defect type which is to be stored in the AFM (Address Failure Memory) 370 that stores the fail signals in increments of addresses. In a case of storing a defect based upon the ordinary fail signal, the AFM 370 stores, at an address that corresponds to the target data, the information that the data output from the memory under test 100 does not match the corresponding anticipated value.

The aforementioned storage mode is selected beforehand by a user of the test apparatus 10 or the like. More specifically, let us consider an arrangement in which determination of whether or not the memory under test 100 is defective is made based upon the error correctability. With such an arrangement, the fail stack selection unit 342 and the BBM selection unit 344 select the defect type based upon the ECC fail signal as the defect type to be stored in the fail stack 350 and the BBM 360. On the other hand, the AFM selection unit 346 selects the defect type based upon the ordinary fail signal as the defect type to be stored in the AFM 370.

Figure 4:
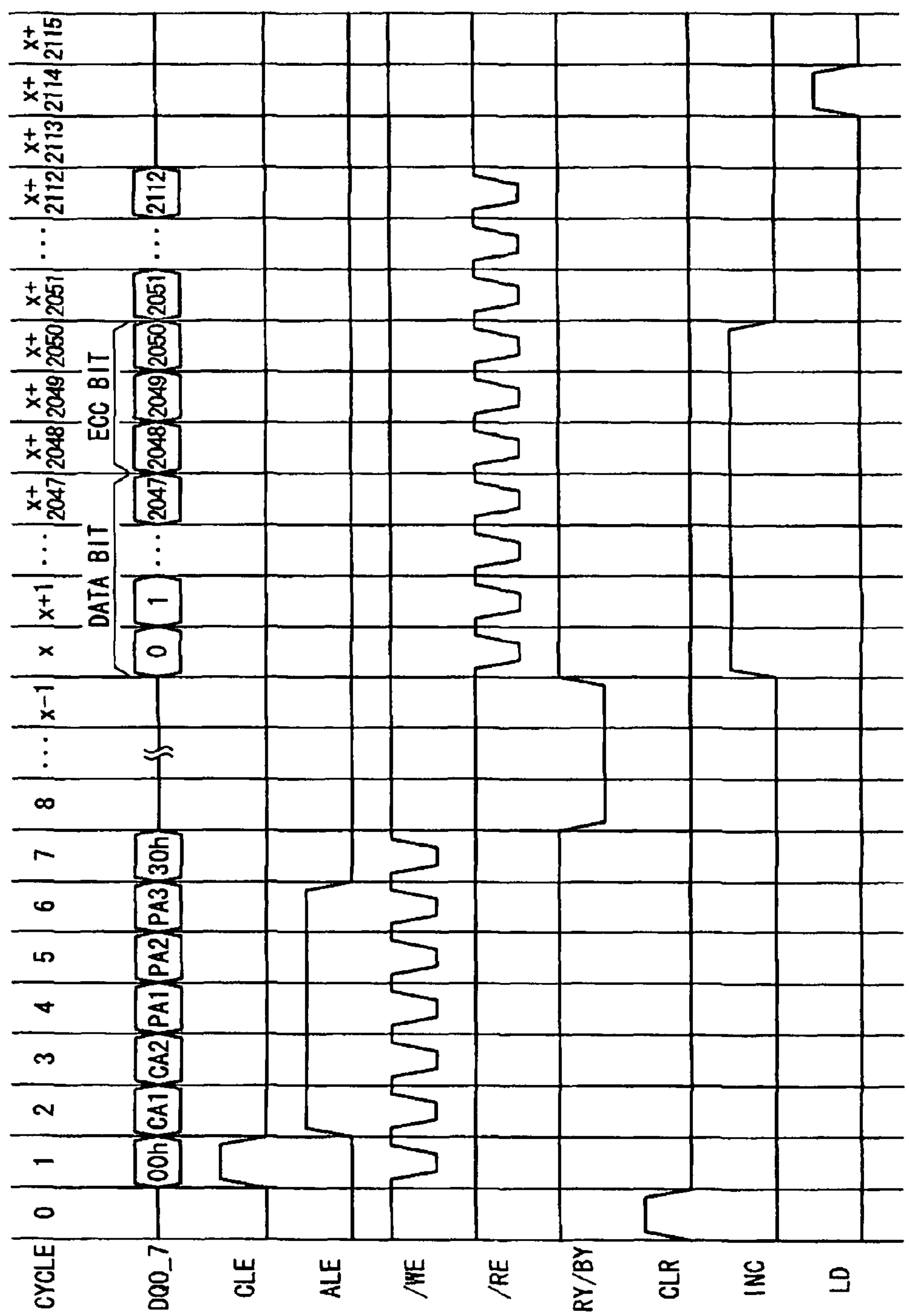
FIG. 4 shows the operation timing of the test apparatus 10 according to the embodiment of the present invention.

FIG. 4 shows the operation timing of the test apparatus 10 according to the present embodiment. The test processing unit 110 writes test data to each page of the memory under test 100. Then, the data processing unit 110 reads out the data thus written from each page, and compares the data thus read out with the corresponding anticipated value. FIG. 4 shows a part of the operation timing, in which the data written to a page is read out from the memory under test 100, and the data thus read out is compared with the corresponding anticipated value.

First, before a new data string is read out for a comparison with the corresponding anticipated value, the pattern generator 130 sets the CLR signal to "1", thereby initializing the count value of the data error count unit 320 (cycle 0). Next the test processing unit 110 supplies a memory read command to the memory under test 100 based upon the test pattern data (cycles 1 through 7). More specifically, the test processing unit 110 supplies a command using the cycle 1, a column address using the cycle 2 through the cycle 3, and a page address using the cycle 4 through the cycle 6, thereby starting the readout processing for the memory under test 100.

Next, the memory under test 100 sequentially outputs the data sets included in the data string stored in the page thus specified, in increments of words according to the memory read command (cycle x through cycle x+2112). Here, the memory under test 100 outputs the data 210 stored in the error correctable region 200 during the cycles from x through x+2047. Subsequently, the memory under test 100 outputs the error correction code 220 stored in the correctable region 200 during the cycles from x+2048 through x+2050. These data sets can be corrected using the error correction code. Accordingly, the pattern generator 130 sets the INC signal to "1". This disables the output from the defect detection unit 330 of a notification regarding the single-bit errors using the OR gate 332 and the gate 334. Furthermore, a combination of the AND gate 310 and the data error count unit 320 starts to count the number of fail bits. As a result, with such an arrangement, for a data string read out from the error correctable region 200, in a case that the count value exceeds the upper limit number, the defect detection unit 330 determines that the memory under test 100 is defective.

Next, the memory under test 100 outputs the data sets stored in the error uncorrectable region 230 during the cycles from x+2051 through x+2112. These data sets cannot be corrected using the error correction code. Accordingly, the pattern generator 130 sets the INC signal to "0". This permits the defect detection unit 330 to output a notification regarding the single-bit errors using the OR gate 332 and the gate 334. Furthermore, the combination of the AND gate 310 and the data error count unit 320 stops to count the number of fail bits. As a result, with such an arrangement, for the data string read out from the error uncorrectable region 230, in a case that at least one data set included in this data string does not match the corresponding anticipated value, the defect detection unit 330 determines that the memory under test 100 is defective.

Next, after comparing the data string with the anticipated value data string, the pattern generator 130 sets the LD signal to "1". Upon reception of the LD signal of "1", the defect detection unit 330 outputs the output of the data error count unit 320 to the fail selection unit 340 via the OR gate 338. With such an arrangement, with regard to the data string read out from the memory under test 100, in a case that the number of data sets that do not match the respective anticipated values exceeds the upper limit number, the defect detection unit 330 notifies the fail selection unit 340 that the memory under test 100 is defective.

In the above-described processing, the test apparatus 10 reads out the data string written to the memory under test 100, and determines whether or not the memory under test 100 is defective based upon the data string thus read out. After completion of the defect detection based upon the data string, the test processing unit 110 sets the CLR signal to "1", thereby initializing the count value stored in the data error count unit 320. Subsequently, the pattern generator 130 instructs the logic comparator 170 to compare the next data string with the corresponding anticipated data string.

With regard to a data string stored in the error correctable region 200, the test apparatus 10 described above determines that the fails detected, each of which indicates that the data did not match the corresponding anticipated value, are permitted as long as these fails are in an error-correctable range. On the other hand, with regard to a data string stored in the error uncorrectable region 230, in a case that at least one fail has been detected, the test apparatus 10 determines that the memory under test 100 is defective. Thus, the test apparatus 10 provides an appropriate test that determines whether or not the memory under test 100 is defective, giving consideration to the error correctability of the memory under test 100.

Figure 5:
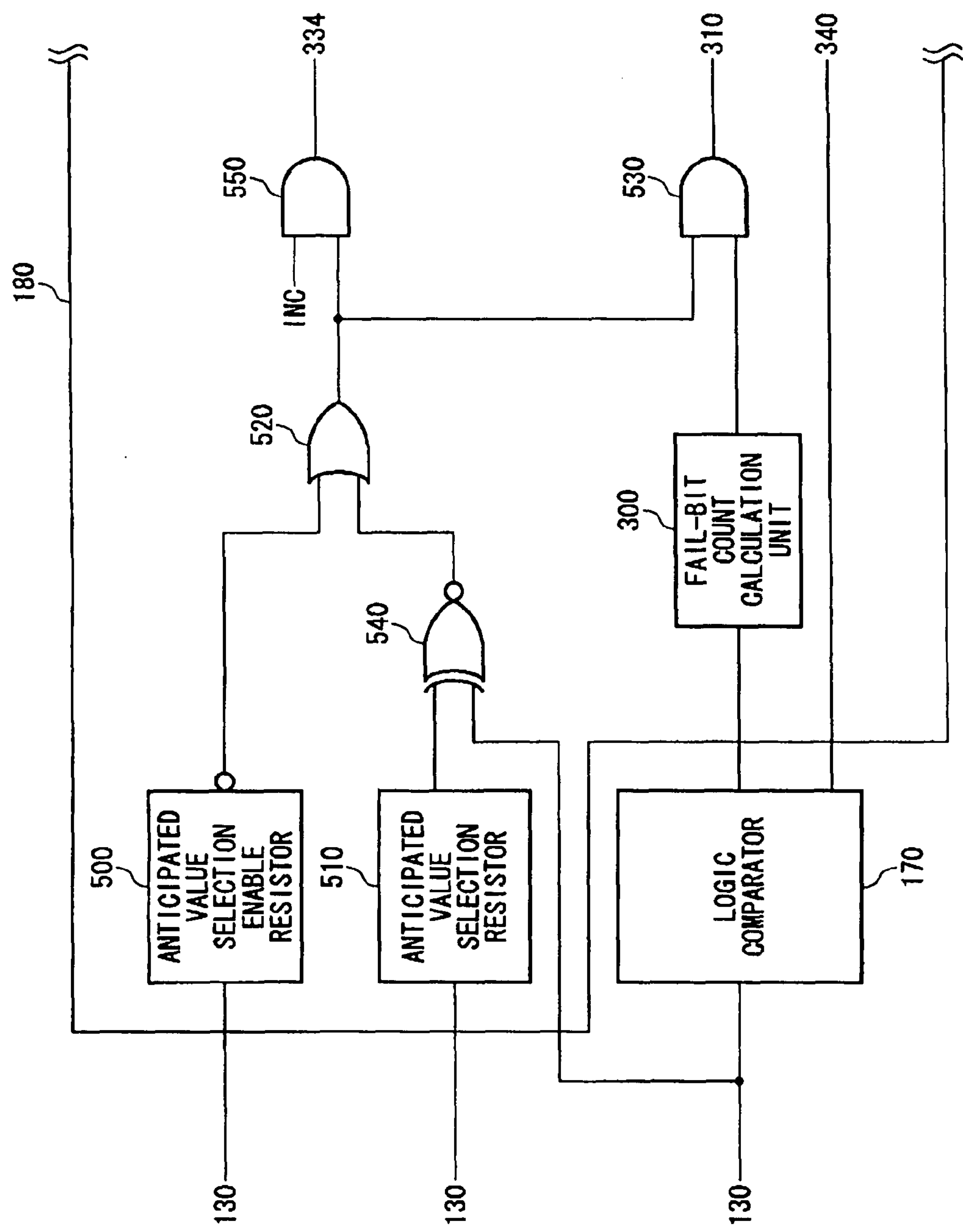
FIG. 5 shows a part of the configuration of the defect determination unit 180 according to a first modification of the embodiment of the present invention.

FIG. 5 shows a part of a configuration of the defect determination unit 180 according to a first modification of the present embodiment along with the logic comparator 170. The defect determination unit 180 determines that fails are permitted under the following two conditions. One condition is that each fail has occurred with regard to a particular data value selected from among 0 and 1. The other condition is that the fails have occurred in an error-correctable range.

The defect determination unit 180 according to the first modification includes an anticipated value selection enable register 500, an anticipated value selection register 510, an OR gate 520, an AND gate 530, an exclusive-NOR gate 540, and a gate 550 shown in FIG. 5, in addition to the fail-bit count calculation unit 300, the AND gate 310, the data error count unit 320, the defect detection unit 330, the fail selection unit 340, the fail stack 350, the BBM 360, and the AFM 370 shown in FIG. 3. In FIG. 5, the components denoted by the same reference numerals as in FIG. 3 have the same functions and configurations as those shown in FIG. 3, and accordingly, description thereof will be omitted below, except for the points of difference.

The anticipated value selection enable register 500 stores an enable signal which indicates whether or not the fails, which are detected according to the input from the pattern generator 130, are to be permitted, based on the condition that each fail has occurred with respect to a selected particular data value, and on the condition that the fails have occurred in a correctable range. The anticipated value selection register 510 stores a predetermined data value which is to be used for the aforementioned condition that each fail has occurred with respect to the predetermined data value, on which condition the fails, which are detected according to the input from the pattern generator 130, are permitted in an error-correctable range. The exclusive-NOR gate 540 outputs the exclusive-NOR of the data value stored in the anticipated value selection register 510 and the anticipated value input to the logic comparator 170. The OR gate 520 outputs the OR of the NOT of the enable signal stored in the anticipated value selection enable register 500 and the output of the exclusive-NOR gate 540. The AND gate 530 computes the AND of each bit of the fail-bit count signal output from the fail-bit count calculation unit 300 and the output of the OR gate 520, in increments of bits. The gate 550 computes the AND of the output of the OR gate 520 and the INC signal, and supplies the AND thus computed to the NOT-input of the gate 334.

In a case that the enable signal stored in the anticipated value selection enable register 500 is "0", the anticipated value selection enable register 500 outputs "1". Accordingly, the output of the OR gate 520 is set to "1", regardless of the output of the exclusive-NOR gate 540. Accordingly, the gate 550 inputs the INC signal into the NOT-input of the gate 334. On the other hand, the AND gate 530 inputs the output of the fail-bit count calculation unit 300 to the AND gate 310. In this mode, the defect determination unit 180 according to the first modification provides a logic configuration equivalent to that shown in FIG. 3, thereby providing the same operation as that of the defect determination unit 180 shown in FIG. 3.

On the other hand, in a case that the enable signal stored in the anticipated value selection enable register 500 is “1”, the anticipated value selection enable register 500 outputs “0”. As a result, the OR gate 520 supplies the output of the exclusive-NOR gate 540 to the gate 550 and the AND gate 530. In this case, in a case that the data value stored in the anticipated value selection register 510 matches the anticipated value supplied from the pattern generator 130, the exclusive-NOR gate 540 outputs the “1” signal, which indicates that these values have matched each other. In this case, the gate 550 inputs the INC signal into the NOT-input of the gate 334. On the other hand, the AND gate 530 inputs the output of the fail-bit count calculation unit 300 to the AND gate 310. In this mode, the defect detection unit 330 determines that the memory under test 100 is defective in a case that the count value counted by the data error count unit 320 exceeds the upper limit value, based on the condition that each fail, which indicates that the data does not match the anticipated value, has occurred with respect to the data value stored in the anticipated value selection register 510. In other words, even in a case that the data string includes data values that do not match the respective anticipated values, the defect detection unit 330 does not determine that the memory under test 100 is defective as long as the count value counted by the data error count unit 320 does not exceed the upper limit number, based on the condition that each fail has occurred with respect to the data value stored in the anticipated value selection register 510. That is to say, the defect detection unit 330 permits such fails.

On the other hand, in a case that the data value stored in the anticipated value selection register 510 does not match the anticipated value supplied from the pattern generator 130, the exclusive-NOR gate 540 outputs the “0” signal, which indicates that these values have not matched each other. In this case, the gate 550 inputs the signal “0” to the NOT-input of the gate 334. On the other hand, the AND gate 530 inputs the output of the bit value “0” to the AND gate 310. Accordingly, the mode enters the fail detection mode using a combination of the OR gate 332 and the gate 334, even in a case of the INC signal of “1”. Accordingly, in a case that at least one data set included in the data string does not match the anticipated value, and in a case that a fail has occurred with respect to the data value that differs from that stored in the anticipated value selection register 510, the defect detection unit 330 determines that the memory under test 100 is defective. In other words, in a case that the data included in the data string does not match the anticipated value, and in a case that the data does not match the data value stored in the anticipated value selection register 510, the defect detection unit 330 does not permit such a fail, and immediately determines that the memory under test 100 is defective.

The defect determination unit 180 according to the first modification described above provides a function of permitting fails in an error-correctable range only on the condition that each fail has occurred with respect to a predetermined particular anticipated value selected from among the data values “0” and “1”. The flash memory has a problem in which the storage cell other than the target cell can change from the storage state “1” to the storage state “0” due to the undesired injection of electrons into the former storage cell in a program-disturb mode. Such an error is nonpermanent. Also, an arrangement having an error correction function of correcting such an error can eliminate such a problem. With the present modification, upon the user of the test apparatus 10 setting the enable signal of the anticipated value selection enable register 500 to “1”, and upon setting the data value of the anticipated value selection register 510 to “1”, the defect determination unit 180 permits fails in an error-correctable range on the condition that each fail has occurred due to the deviation of the storage state from “1” to “0”.

On the other hand, let us consider a case in which the value “1” is output instead of the anticipated value “0”. In this case, it is assumed that the error is not due to the program disturb mode, but is due to a permanent defect of the storage cell. Thus, the defect determination unit 180 according to the present modification provides a function as follows. That is to say, upon setting the enable signal of the anticipated value selection enable register 500 to “1”, and upon setting the data value of the anticipated value selection register 510 to “1”, the defect determination unit 180 permits fails in an error-correctable range under the condition that each fail has occurred due to a deviation from the storage state “1” to the storage state “0”. On the other hand, in a case that at least one fail has occurred due to a deviation from the storage state “0” to the storage state “1”, the determination unit 180 immediately determines that the memory under test 100 is defective.

Figure 6:
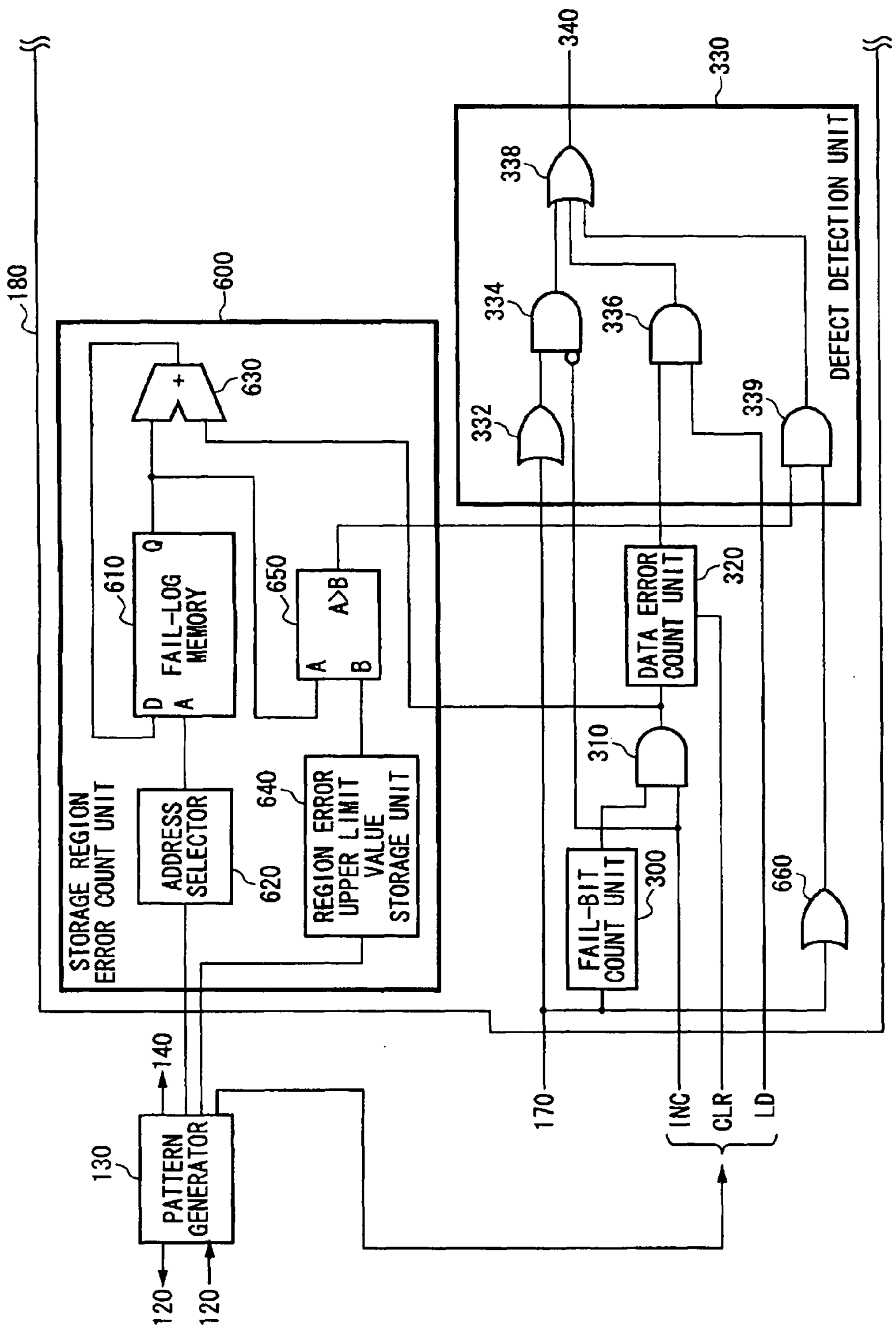
FIG. 6 shows a part of the configuration of the defect determination unit 180 according to a second modification of the embodiment of the present invention.

FIG. 6 shows a part of the configuration of the defect determination unit 180 according to a second modification of the present embodiment, along with the pattern generator 130. The defect determination unit 180 according to the present modification stores the number of error-detection instances for at least one data bit during the data-string reading/writing test performed for the same storage region. With such an arrangement, in a case that the aforementioned number of error-detection instances exceeds an upper limit value, the defect determination unit 180 determines that the memory under test 100 is defective, even if the number of error-detection instances is within an error-correctable range.

The defect determination unit 180 according to the second modification includes a storage region error count unit 600, an OR gate 660, the fail-bit count calculation unit 300, the AND gate 310, the data error count unit 320, the defect detection unit 330, and the defect detection unit 330, shown in FIG. 6, in addition to the fail-selection unit 340, the fail stack 350, the BBM 360, and the AFM 370 shown in FIG. 3. In FIG. 6, the components denoted by the same reference numerals as in FIG. 3 have the same functions and configurations as those shown in FIG. 3, and accordingly, description thereof will be omitted below, except for the points of difference.

The storage region error count unit 600 counts the number of error-detection instances, in which the data included in the data string read out from the storage region does not match the anticipated value, for each storage region of the memory under test 100. The storage region error count unit 600 according to the present embodiment counts the number of fails for each page of the memory under test 100 with respect to the data string read out from the error-correctable region 200 within the target page.

The storage region error count unit 600 includes fail-log memory 610, an address selector 620, an adder 630, a region error upper limit storage unit 640, and a comparator 650. The fail-log memory 610 stores the number of fails for each page of the memory under test 100 with respect to the data string read out from the error-correctable region 200 included within the target page. The term “the number of fails” as used here represents the number of instances (the number of bits)

in which the data included in the data string does not match the anticipated value. The address selector 620 receives, from the pattern generator 130, the address included in the read command issued to the memory under test 100. Furthermore, the address selector 620 supplies, to the fail-log memory 610, the address in the fail-log memory 610 that corresponds to the page read out from the memory under test 100. In this step, the address selector 620 instructs the fail-log memory 610 to selectively output the data stored at the address that corresponds to the target page, i.e., the number of fails that corresponds to the target page.

The adder 630 makes the sum of the output of the AND gate 310 and the data output from the fail-log memory 610 according to the address specified by the address selector 620, and updates the data stored in the fail-log memory 610 to be the sum thus calculated. With such an arrangement, every time the adder 630 receives one word of data from the memory under test 100, the adder 630 adds the number of data sets that do not match the respective anticipated values to the corresponding number of fails stored in the fail-log memory 610 in association with the data string that includes the data sets.

The region error upper limit storage unit 640 receives, from the pattern generator 130, the region error upper limit value which is the upper limit value of the number of fails which are permitted for each page, and stores the region error upper limit thus received. In a case that the number of fails thus stored in the fail-log memory 610 in association with a page read out from the memory under test 100 exceeds the region error upper limit value stored in the region error upper limit storage unit 640, the comparator 650 outputs the "1" signal, which indicates that the region upper limit value has exceeded the region error upper limit.

The OR gate 660 computes the OR of the pass/fail signals output from the logic comparator 170 in the same way as with the OR gate 332. Accordingly, in a case that at least one data bit does not match the corresponding anticipated value, the OR gate 660 outputs the "1" signal, which indicates that at least one data bit does not match the corresponding anticipated value. The AND gate 339 outputs the AND of the output of the comparator 650 and the output of the OR gate 660. Accordingly, in a case that the number of fails thus counted exceeds the region error upper limit for a given page, and in a case that at least one data set does not match the corresponding anticipated value for this page, the AND gate 339 determines that the memory under test 100 is defective, and notifies the fail selection unit 340 via the OR gate 338 that the memory under test 100 is defective.

With the defect determination unit 180 described above, in a case that the count value counted by the storage region error count unit 600 is greater than a predetermined region error upper limit value for a given storage region that stores a data string which is to be read out, and in a case that at least one data set included in the data string does not match the corresponding anticipated value, the defect detection unit 330 determines that the memory under test 100 is defective. On the other hand, let us consider a case in which the aforementioned count value is equal to or smaller than the region error upper limit value. In this case, in a case that the count value counted by the data error count unit 320 exceeds the upper limit value, the defect detection unit 330 determines that the memory under test 100 is defective. Thus, in a case that there are a great number of fails in a given page, there is a high possibility that the page includes permanent defects. Accordingly, in such a case, the defect determination unit 180 determines that the memory under test 100 is defective, regardless of the error correctability.

While the present invention has been described thus by way of embodiments, the technical scope of the present invention is not restricted to the scope of the embodiments described above. It is to be clearly understood by those skilled in this art that various modifications and improvements may be made to the above-described embodiments. It is to be clearly understood from the Claims that such modifications and improvements are also encompassed within the technical scope of the present invention.

For example, the defect determination unit 180 may have both the function described with reference to FIG. 5 and the function described with reference to FIG. 6. Now, let us consider a case in which fails have occurred in the flash memory due to deviation from the storage state "1" to the storage state "0". Even in such a case, with such an arrangement, in a case that such bit errors occur with high frequency, the defect determination unit 180 counts the number of fails that exceeds the region error upper limit Such an arrangement provides proper detection of permanent defects which cause deviation from the storage state "1" to the storage state "0".

The present invention provides a test apparatus having a function whereby, in a case that the detected error is correctable, determination is not made that the memory under test is defective.

The invention claimed is:

1. A test apparatus for testing memory under test which stores a data string that includes an error correction code in the form of additional data, said test apparatus comprising:

a logic comparator which compares each of the data sets included in the data string read out from said memory under test with a corresponding anticipated value created beforehand;

a data error count unit which counts the number of data sets that do not match said respective anticipated values; and a defect detection unit that determines that said memory under test is defective in a case that the count value counted by said data error count unit exceeds a predetermined upper limit value which is equal to or greater than 1.

2. A test apparatus according to claim 1, wherein the upper limit value is the maximum number of errors that can be corrected for each data set using the error correction code.

3. A test apparatus according to claim 1, for testing the memory under test having a first storage region that stores a data string including an error correction code in the form of additional data and a second storage region that stores a data string without involving the error correction code, wherein said defect detection unit determines that said memory under test is defective in a case that the count value exceeds the upper limit number for the data string read out from the first storage region and wherein said defect detection unit also determines that said memory under test is defective in a case that at least one data set stored in a data string does not match a corresponding anticipated value for the data string read out from the second storage region.

4. A test apparatus according to claim 1, wherein said logic comparator serially compares the data set included in each data string with the corresponding anticipated value for a plurality of said data strings read out from separate storage regions in said memory under test, and wherein said data error count unit increments the count value for each data string every time data that does not match the corresponding anticipated value is detected, and which further comprises a test processing unit that, upon completion of a defect detection test for each data string, initializes the count value, and instructs said logic comparator to start a comparison between the next data string and the corresponding anticipated value.

5. A test apparatus according to claim 1, wherein, in a case that the data included in the data string does not match the anticipated value, said defect detection unit determines that said memory under test is defective if either (i) the data does not match a predetermined data value or (ii) the data matches a predetermined data value and the number of data sets that do not match the anticipated value exceeds the upper limit number.

6. The test apparatus according to claim 5, wherein the upper limit value is the maximum number of errors that can be corrected for each data set using the error correction code.

7. The test apparatus according to claim 5, for testing the memory under test having a first storage region that stores a data string including an error correction code in the form of additional data and a second storage region that stores a data string without involving the error correction code, wherein said defect detection unit determines that said memory under test is defective in a case that the count value exceeds the upper limit number for the data string read out from the first storage region, and wherein said defect detection unit also determines that said memory under test is defective in a case that at least one data set stored in a data string does not match a corresponding anticipated value for the data string read out from the second storage region.

8. The test apparatus according to claim 5, wherein said logic comparator serially compares the data set included in each data string with the corresponding anticipated value for a plurality of said data strings read out from separate storage regions in said memory under test, and wherein said data error count unit increments the count value for each data string every time data that does not match the corresponding anticipated value is detected, and which further comprises a test processing unit that, upon completion of a defect detection test for each data string, initializes the count value and instructs said logic comparator to start a comparison between the next data string and the corresponding anticipated value.

9. The test apparatus according to claim 5, further comprising a test processing unit which writes data strings multiple times to the same storage region in said memory under test reads out the data string thus written from said memory under test after every writing processing and provides the same to the logic comparator; and a storage region error count unit which counts, for each storage region of the memory under test, the number of error-detection instances in which the data included in the data string read out from the storage region does not match the corresponding anticipated value, wherein, in a case that the count value counted by said storage region error count unit for the storage region that stores the data string to be read out is greater than a predetermined value, said defect detection unit determines that said memory under test is defective if at least one data set included in the data string does not match the anticipated value, and wherein, in a case that the count value counted by said storage region error count unit for the storage region that stores the data string to be read out is equal to or smaller than the predetermined value, said defect detection unit determines that said memory under test is defective if the count value counted by said data error count unit exceeds the upper limit value.

10. The test apparatus according to claim 5, further comprising an anticipated value selection register that stores a data value indicating a defect caused by a program disturb mode, wherein, in a case that the data included in the data string does not match the anticipated value, said defect detection unit determines that said memory under test is defective if either (i) the anticipated value does not match the data value stored in the anticipated value selection register or (ii) the anticipated value matches the data value stored in the anticipated value selection register and the number of data sets that do not match the anticipated value exceeds the upper limit number.

11. A test apparatus according to claim 1, further comprising a test processing unit which writes data strings multiple times to the same storage region in said memory under test reads out the data string thus written from said memory under test after every writing processing and provides the same to the logic comparator; and a storage region error count unit which counts, for each storage region of the memory under test, the number of error-detection instances in which the data included in the data string read out from the storage region does not match the corresponding anticipated value, wherein, in a case that the count value counted by said storage region error count unit for the storage region that stores the data string to be read out is greater than a predetermined value, said defect detection unit determines that said memory under test is defective if at least one data set included in the data string does not match the anticipated value, and wherein, in a case that the count value counted by said storage region error count unit for the storage region that stores the data string to be read out is equal to or smaller than the predetermined value, said defect detection unit determines that said memory under test is defective if the count value counted by said data error count unit exceeds the upper limit value.

12. A test method for testing memory under test which stores a data string that includes an error correction code in the form of additional data, said test method comprising:

comparing each of the data sets included in the data string read out from the memory under test with a corresponding anticipated value created beforehand;

counting the number of data sets that do not match the respective anticipated values; and detecting that the memory under test is defective when the number of data sets that do not match the respective anticipated values exceeds a predetermined upper limit value which is equal to or greater than 1.

* * * * *